United States Patent [19]
Dutta

[11] Patent Number: 5,075,756
[45] Date of Patent: Dec. 24, 1991

[54] LOW RESISTANCE CONTACTS TO SEMICONDUCTOR MATERIALS

[75] Inventor: Ranjan Dutta, Lawrenceville, N.J.

[73] Assignee: AT&T Bell Laboratories, Murray Hill, N.J.

[21] Appl. No.: 576,551

[22] Filed: Aug. 31, 1990

Related U.S. Application Data

[62] Division of Ser. No. 478,875, Feb. 12, 1990, Pat. No. 5,011,792.

[51] Int. Cl.$^5$ ............ H01L 23/48; H01L 29/40; H01L 21/44; H01L 21/48
[52] U.S. Cl. ............ 357/67; 357/65; 437/180; 437/184
[58] Field of Search ............ 357/65, 67, 68; 437/184, 180

[56] References Cited

U.S. PATENT DOCUMENTS

| | | | |
|---|---|---|---|
| 3,601,888 | 8/1971 | Engeler et al. | 357/67 |
| 4,012,767 | 3/1977 | Brown et al. | 357/65 |
| 4,270,136 | 5/1981 | Toyokura et al. | 357/67 |
| 4,523,212 | 6/1985 | Hawrylo | 357/17 |
| 4,545,115 | 10/1985 | Bauer et al. | 29/590 |
| 4,662,063 | 5/1987 | Collins et al. | 29/584 |
| 4,829,363 | 5/1989 | Thomas et al. | 357/67 |
| 4,868,637 | 9/1989 | Clements et al. | 357/65 |
| 4,872,047 | 10/1989 | Fister et al. | 357/67 |

OTHER PUBLICATIONS

"On the Formation of Binary Compounds in Au/InP System", by A. Piotrowska et al., *Journal of Applied Physics*, vol. 52, No. 8, Aug. 1981, pp. 5112–5117.

"The Migration of Gold from the p-Contact as a Source of Dark Spot Defects in InP/InGaAsP LED's", by A. K. Chin et al., *IEEE Transactions on Electron Devices*, vol. ED-30, No. 4, Apr. 1983, pp. 304–309.

"The Design and Realization of a High Reliability Semiconductor Laser for Single-Mode Fiber-Optical Communication Links", by A. R. Goodwin et al., *Journal of Lightwave Technology*, vol. 6, No. 9, Sep. 1988, pp. 1424–1434.

"Interaction Between Zinc Metallization and Indium Phosphide", by S. Nakahara et al., *Solid-State Electronics*, vol. 27, No. 6, Jun. 1984, pp. 557–564.

"Thermally Stable Ohmic Contact to n-Type GaAs, I. MoGeW Contact Metal", by M. Murakami et al., *Journal of Applied Physics*, vol. 62, No. 8, Oct. 15, 1987.

Primary Examiner—Andrew J. James
Assistant Examiner—Carl Whitehead, Jr.
Attorney, Agent, or Firm—R. B. Anderson

[57] ABSTRACT

An ohmic contact to a III-V semiconductor material comprises substantially eighty to ninety-five percent by weight of tungsten, five to ten percent by weight of antimony, and zero to fifteen percent by weight of indium. The materials are simultaneously sputtered from separate targets in a sputtering reactor.

5 Claims, 1 Drawing Sheet

LOW RESISTANCE CONTACTS TO SEMICONDUCTOR MATERIALS

This is a division of application Ser. No. 478,875 filed Feb. 12, 1990 now U.S. Pat. No. 5,011,792, granted Apr. 30, 1991.

TECHNICAL FIELD

This invention relates to methods for making low resistance contacts to semiconductor materials and, more particularly, to methods for making ohmic contacts to III–V materials.

BACKGROUND OF THE INVENTION

One of the most significant developments in semiconductor technology in recent years has been the increased use and importance of compound semiconductors, particularly the group III–V compounds composed of elements III and V of the periodic table such as gallium arsenide and indium phosphide. The band gap characteristics of III–V semiconductors make them particularly useful as photonic devices such as lasers, light emitting diodes (LEDs) and photodetectors. The high electron mobility of such materials also make them promising for the production of high speed electronic devices such as high speed integrated circuits. Photonic devices are often made by forming on the surface of the substrate a succession of epitaxial layers (an epitaxial layer is a layer of material deposited on a substrate such that it has a crystal structure that constitutes in effect an extension of the crystal structure of the substrate). For example, a laser based on indium gallium arsenide phosphide epitaxially grown on an indium phosphide substrate emits light in a wavelength range where absorption losses of silica based optical fibers is at a minimum. Also, modulation doped hetero structures grown on indium phosphide substrates such as $In_{0.53}Ga_{0.47}As/InP$ have been used to make high speed integrated circuit devices.

Most useful III–V semiconductor devices require a low resistance or ohmic metal contact to the III–V material for applying electrical current to, or removing electrical current from, the device. Such ohmic contacts are usually made by evaporating a thin gold film onto the semiconductor substrate. While such gold films have reasonably good electrical characteristics, they frequently do not adhere well to the substrate and are often characterized by poor uniformity, reproducibility and reliability. Many of these problems probably result largely from the fact that the gold alloys to the III–V material and then diffuses into the substrate. The papers, "On the Formation of Binary Compounds in Au/InP System," A. Piotrowska et al., *Journal of Applied Physics*, Vol. 52, No. 8, August 1981, pp. 5112–5117, and "The Migration of Gold from the p-contact as a Source of Dark Spot Defects in InP/InGaAsP LED's," A. K. Chin et al., *IEEE Transactions of Electronic Devices*, Vol. ED-30, No. 4, April 1983, pp. 304–309, document the large diffusion depth of gold into the substrate and the problems that can result. The paper, "The Design and Realization of a High Reliability Semiconductor Laser for Single-Model Fiber-Optical Communication Links," A. R. Goodwin et al., *Journal of Light Wave Technology*, Vol. 6, No. 9, September 1988, pp. 1424–1434, further documents degradation due to the electromigration of gold into the device during operation. Furthermore, as described in "Interaction Between Zinc Metallization and Indium Phosphide," S. Nakahara et al., *Solid-State Electronics*, Vol. 27, No. 6, June 1984, pp. 557–564, dopant atoms added to the contact diffuse rapidly through indium phosphide, which can result in a reduction of the ohmic behavior. A high contact resistance not only results in low efficiency and reduces the speed of such devices, but also increases the temperature of the active region leading to a higher threshold current. Another consideration in designing ohmic contact is the desirability of using a metal that can be patterned by reactive ion etching (reactive ion etching or dry etching is a well-known technique for using ions of a plasma selectively to etch metal films).

Accordingly, there has been a long-felt need for a method for making ohmic contacts to III–V semiconductor substrates that are uniform, reproducible, reliable, adhere well, do not interfere with the electrical characteristics of the semiconductor substrate, and are amenable to reactive ion etching.

SUMMARY OF THE INVENTION

In accordance with the invention, an ohmic contact to a substrate of III–V semiconductor material comprises a thin film composed of at least tungsten and antimony. Preferably, the contact should be eighty to ninety-five percent by weight of tungsten, five to ten percent by weight of antimony and zero to fifteen percent by weight of indium. The film is preferably applied by simultaneously sputtering tungsten, antimony and indium onto the substrate in a manner that will be described in greater detail below.

Ohmic contacts in accordance with the invention do not alloy to a III–V semiconductor substrate such as indium phosphide but they nevertheless adhere well; specifically, I have found that the presence of indium in the contact significantly aids contact adherence and reduces sheet resistance. There is very little metal diffusion into the substrate and little electromigration during operation. The contacts have been found to be uniform, reproducible, reliable, and amenable to patterning by known reactive ion etching techniques.

These and other objects, features and benefits of the invention will be better understood from a consideration of the following detailed description taken in conjunction with the accompanying drawing.

DETAILED DESCRIPTION

The use of ohmic contacts on various semiconductor devices such as lasers, integrated circuits, photodetectors and light emitting diodes is so well known and well understood in the art that their use in these different contexts will, for the sake of brevity, not be described. Basically, an ohmic contact is one in which there is a small or no electronic barrier at the interface between the metal contact and the semiconductor, as opposed to an interface which constitutes a junction barrier or Schottky barrier. With the electronic barrier being very small, there is a small resistance to the flow of electricity across the interface. Various methods of depositing metals on semiconductors to make such contacts are well known and the following description presupposes a knowledge of such methods, some of which are exemplified in the prior art cited above.

Figure 1:
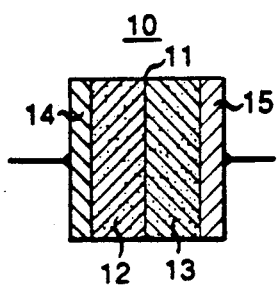
FIG. 1 is a schematic sectional view of a semiconductor diode having an ohmic contact in accordance with the invention.

FIG. 1 shows schematically and only for purposes of illustration a semiconductor diode 10 having a junction 11 defined at the interface between semiconductor portions 12 and 13 that are doped with p-type and n-type impurities, respectively. Metal contacts 14 and 15 are used to connect the diode to external circuitry and illustratively both of them are required to be low resistance or ohmic contacts. The semiconductor regions 12 and 13 are both of III–V semiconductor materials and the diode may be of the type which is used as a photodetector; that is, it generates electricity upon the impingement of light on junction 11. III–V semiconductor diodes, as is known in the art, can also be used as lasers, LEDs and rectifiers.

In accordance with the invention, the metal ohmic contact 14 is composed of eighty to ninety-five percent by weight of tungsten, five to ten percent by weight of antimony, and zero to fifteen percent by weight of indium. Metal contacts of this composition have been found to give extremely low resistance contact to the semiconductor. The presence of indium significantly reduces sheet resistance, and it aids adherence, but is not absolutely essential for obtaining an ohmic contact.

Figure 2:
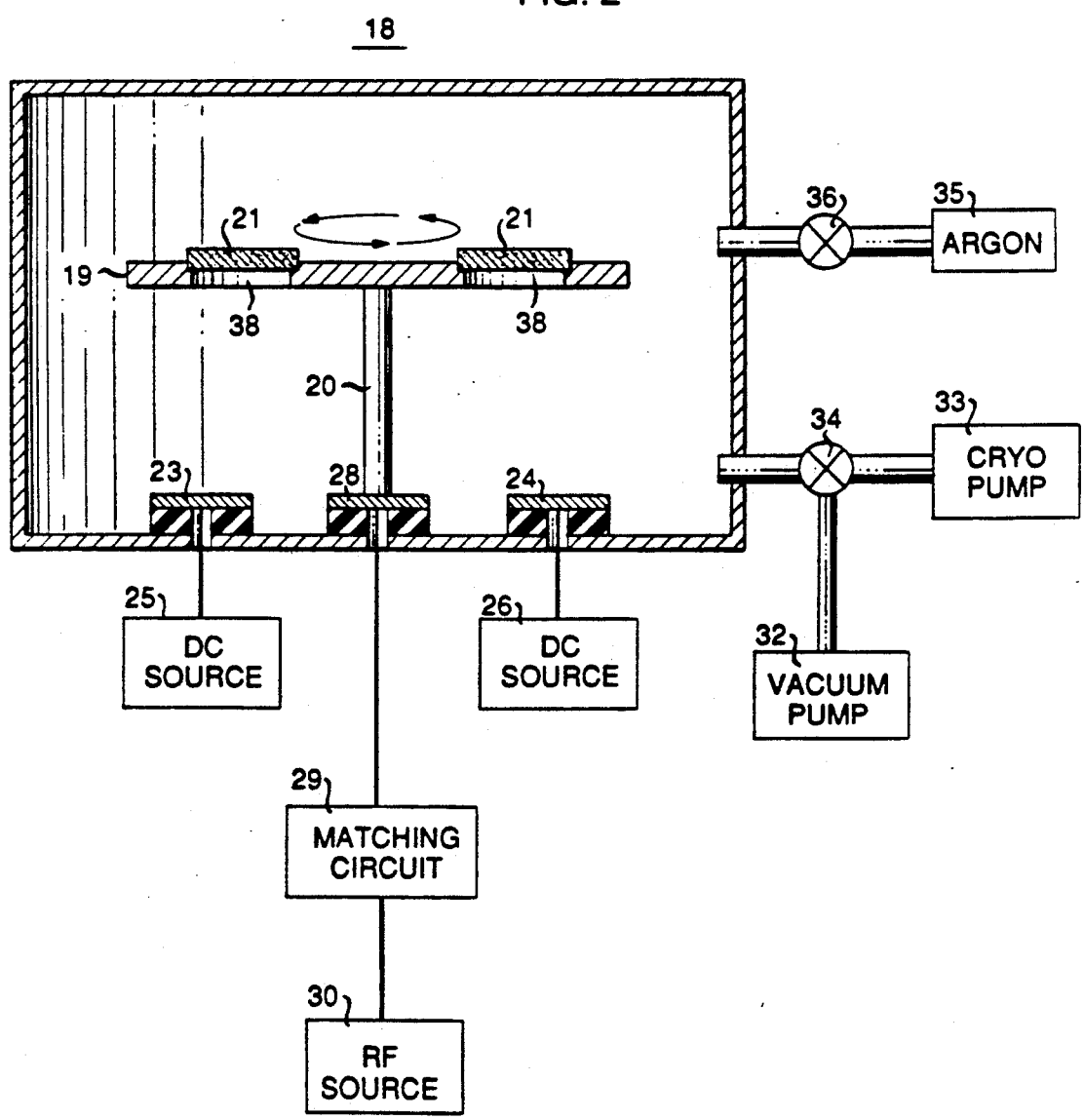
FIG. 2 is a schematic diagram of apparatus for sputtering metal onto a semiconductor to make ohmic contacts in accordance with the invention.

FIG. 2 illustrates schematically sputtering apparatus 18 that illustratively is used for applying ohmic contacts to III–V semiconductors in accordance with the invention. The sputtering apparatus 18, which has been used for demonstrating the invention, is a machine known as the CVC 601 Sputtering Machine, which is commercially available from the CVC Company of Rochester, N.Y. The machine includes a rotatable support 19, driven by a central axle 20, for supporting a plurality of semiconductor wafers 21. Located below the wafers are a series of targets 23, 24 and 28 which constitute sources of the metals to be applied. A tungsten target 23 and an indium target 24 are respectively connected to dc sources 25 and 26. A target 28 of antimony is connected through a matching circuit 29 to a source of radio-frequency power 30. The sputtering apparatus 18 is evacuated by a vacuum pump 32 and is further evacuated by a cryo pump 33, both of which are selectively connected to the sputtering apparatus by a valve 34. A controlled amount of argon is introduced into the apparatus from a source 35 selectively connected to the sputtering apparatus by a valve 36.

As is known in the art, the combination of vacuum pump 32 and cryo pump 33 produce a near vacuum within the sputtering apparatus 18 and argon source 35 provides a precisely controlled source of gas molecules within the apparatus. The dc sources 25 and 26 and the r-f source 30 accelerate gas molecules toward the targets 23, 24 and 28, and the collision of such molecules provides enough energy to cause molecules of the target material to be ejected. These target molecules then collect on the underside 38 of wafers 21. In accordance with the invention, all three metals are sputtered simultaneously, with the proportions of each metal sputtered being controlled through control of the power sources 25, 26 and 30.

After sputtering, the wafers 21 are preferably annealed by heating in a separate furnace. Various operations such as photolithographic masking and etching may then be used to define a number of electrical contacts from the metal film that has been coated on the wafer. In accordance with one aspect of the invention, the metal film can be cut or patterned by a known process known as reactive ion etching. Typically, the wafer is thereafter cut to form a number of individual chips which eventually constitute individual electronic devices.

In demonstrations of the invention that have been made, indium phosphide substrates were doped with either tin or zinc to give n-type or p-type doping, respectively, of $10^{18}$ atoms per cubic centimeter. The substrates were cleaned of surface oxide by etching in a solution of sulfuric acid and hydrogen peroxide, were then spray rinsed in deionized water and blown dry. They were mounted as shown in FIG. 1 after which the sputtering apparatus was cryo pumped to a base pressure of about $2 \times 10^{-7}$ torr. The antimony target was biased with 100–150 watts of r-f power during operation, and the tungsten and indium targets were biased with dc voltages of between eighty and two hundred fifty volts. The argon pressure during sputtering was held at five millitorr, the equivalent of about fifty standard cubic centimeters per minute, in which case the sputtering rate was typically one to two angstroms per second. The substrates revolved above the targets at ten revolutions per minute with their (100) crystallographic surfaces being exposed for coating. The contacts were found to be ohmic with eighty to ninety-five percent by weight of tungsten, five to ten percent by weight of antimony, and zero to fifteen percent by weight of indium. After sputtering, the samples were annealed in an argon atmosphere at a temperature of 300°–450° C. for between ten and thirty minutes.

As is known, the sputtering rate for dc biased targets is a function of applied dc voltage and the rate for r-f biased targets is a function of applied r-f power. I obtained a preponderance of sputtered tungsten over indium by biasing tungsten target 23 at voltages of between two hundred and two hundred fifty volts while biasing indium target 24 at voltages of between eighty and one hundred fifty volts. As is known, sputtering rate is also a function of argon pressure. If desired, one could sputter from a single target containing all three metals or one containing two metals. Pure antimony does not sputter too dependably when biased by a dc source because it has a high resistance, giving it a tendency to accumulate charge, and for this reason r-f sputtering from antimony target 28 is preferred. If combined with more conductive metals, it could easily be dc sputtered. Further, I know of no reason that would in principle preclude other plating methods, such as evaporation.

The contacts that were made were found to be ohmic after annealing. Contacts made to n-type indium phosphide were ohmic prior to annealing, but p-type contacts appear to require annealing. For pattern dimensions of between fifty and two hundred fifty micrometers, the contact resistance was found to be in the range of $10^{-6}$ ohms per square centimeter. The sheet resistance of the films having a thickness of about one thousand angstroms was approximately twelve ohms per square when annealed at 400° C. Microscopic examination showed that there was little or no alloying of the metal to the semiconductor. As a consequence, there was little diffusion of the metal into the semiconductor as compared with the diffusion of gold in an indium phosphide matrix under similar conditions. From these examinations, I have inferred that the antimony of the structure provides a low band gap interfaced to the semiconductor, while indium in the metal contact minimizes out-diffusion of indium from the semiconductor substrate. Unlike alloy contacts, the solid phase reacted tungsten-indium-antimony contact retains the sharp lateral conductivity profile even after annealing at 450° C.

It is to be understood that the embodiments shown are merely illustrative of methods for practicing the invention. While sputtering is the preferred method for applying the component metals, other methods could alternatively be used. Annealing aids long-term stability and reduces contact resistance, but is not essential in obtaining ohmic contacts in n-type substrates. Various other modifications and embodiments may be made by those skilled in the art without departing from the spirit and scope of the invention.

I claim:

1. An electronic device comprising a substrate of III-V semiconductor material and a substantially ohmic metal contact adhered to said substrate characterized in that:
   the ohmic contact comprises a thin film composed of at least tungsten and antimony.

2. The electronic device of claim 1 further characterized in that:
   the ohmic contact comprises substantially eighty to ninety-five per cent by weight parts of tungsten, five to ten percent by weight of antimony, and zero to fifteen percent by weight of indium.

3. The electronic device of claim 2 further characterized in that:
   the tungsten, antimony and indium are applied to the substrate by sputtering.

4. The electronic device of claim 3 further characterized in that:
   the sputtering of the tungsten, indium and antimony are done simultaneously;
   and the sputtering of tungsten and indium is done by dc sputtering and the sputtering of antimony is done by r-f sputtering.

5. The device of claim 4 further characterized in that:
   the substrate comprises crystalline indium phosphide.

* * * * *